United States Patent
Rasovsky et al.

(12) 
(10) Patent No.: US 6,362,508 B1
(45) Date of Patent: Mar. 26, 2002

(54) TRIPLE LAYER PRE-METAL DIELECTRIC STRUCTURE FOR CMOS MEMORY DEVICES

(75) Inventors: Michael Rasovsky, Migdal Haemek; Menachem Vofsi, Kiryat Tivon; Zmira Shterenfeld-Lavie, Migdal Haemek, all of (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 0 days.

(21) Appl. No.: 09/542,501

(22) Filed: Apr. 3, 2000

(51) Int. Cl.[7] .......................................... H01L 21/8244
(52) U.S. Cl. ...................... 257/369; 257/641; 257/640; 438/238; 438/563; 438/923; 438/783
(58) Field of Search .................................. 257/369–377, 257/633–650; 438/199–208, 558–563, 238, 253–256, 396–399, 761–763, 783, 698–702, 923

(56) References Cited

U.S. PATENT DOCUMENTS 5,731,130 A * 3/1998 Tseng .......................... 438/396
6,096,654 A * 8/2000 Kirchhoff et al. ........... 438/699

* cited by examiner

Primary Examiner—Jey Tsai
(74) Attorney, Agent, or Firm—Bever, Hoffman & Harms, LLP; Patrick T. Bever

(57) ABSTRACT

A CMOS memory device includes source and drain regions diffused into a substrate, a polysilicon gate structure formed over a channel region located between the first and second diffusion regions, and a pre-metal dielectric structure formed over the polysilicon gate structure. The pre-metal dielectric structure is a triple layer structure including a lower Borophosphosilicate glass (BPSG) layer formed over the polysilicon gate structure, a Nitride layer formed on the lower BPSG layer, and an upper dielectric layer (e.g., BPSG or USG) formed on the Nitride layer. The Phosphorous concentration in the lower BPSG layer is greater than the Phosphorous concentration in the upper dielectric layer, thereby providing retention protection for the underlying memory structures while facilitating optimal chemical mechanical polishing (CMP) planarization characteristics. The Nitride layer acts as a barrier to impede the migration of Phosphorous from the lower BPSG layer to the upper dielectric layer, and to prevent the migration of impurities from the upper dielectric layer to the lower dielectric layer that are introduced during CMP planarization.

20 Claims, 6 Drawing Sheets

US 6,362,508 B1

TRIPLE LAYER PRE-METAL DIELECTRIC STRUCTURE FOR CMOS MEMORY DEVICES

FIELD OF THE INVENTION

The present invention relates to integrated circuits that are fabricated using advanced CMOS techniques. More specifically, the present invention relates to a structure and method used in the fabrication of CMOS memory devices.

RELATED ART

CMOS memories are widely used, for example, as flash EPROM and EEPROM memory devices. A CMOS memory cell typically includes source and drain regions diffused into a substrate and separated by a channel region, a memory structure (e.g., polysilicon) positioned on a gate oxide over the channel region, a dielectric material formed over the memory structure, and metallization formed on the dielectric that is connected to contact structures extending through vias formed in the dielectric to provide electrical connection to the source and drain regions. The dielectric material of the CMOS memory cell is referred to herein as "pre-metal" to indicate that it is formed before metallization. The CMOS memory cell is programmed/erased by charging/discharging the memory structure, thereby controlling signal currents generated in the source and drain regions.

Borophosphosilicate glass (BPSG) and Tetraethyl Orthosilicate (TEOS) undoped silicate glass are commonly used pre-metal dielectric materials in CMOS memory devices. BPSG is particularly desirable for this purpose because it can be produced with relatively high amounts of Phosphorous that helps maintain the charge stored in the underlying memory structures (i.e., memory retention).

Advanced CMOS fabrication techniques require planarization of, for example, the pre-metal dielectric using a chemical mechanical polishing (CMP) process prior to metallization to achieve adequate depth of focus during subsequent photolithography processes. However, it is difficult to achieve suitable planarization using a CMP process when a high amount of dopant (e.g., Phosphorous) is present in the pre-metal dielectric material. Therefore, a problem arises with the use of BPSG as the pre-metal dielectric material in CMOS memory devices because the low Phosphorous concentrations that are required to optimize CMP planarization produce poor memory retention characteristics, and the high Phosphorous concentrations that are required to produce optimal memory retention characteristics result in less than optimal CMP planarization.

What is needed is a pre-metal dielectric structure that provides both memory retention and facilitates CMP planarization.

SUMMARY

The present invention is directed to a triple layer pre-metal dielectric structure formed between the memory structures and the first metal layer of a CMOS memory device. The triple layer pre-metal dielectric includes a lower dielectric layer that is relatively heavily doped to provide optimal retention for the underlying memory structures, an upper dielectric layer that is relatively lightly doped to facilitate optimal CMP planarization, and an intermediate isolation layer formed between the lower and upper dielectric layers. In accordance with the present invention, the intermediate isolation layer is formed from a material that impedes the migration of dopant from the relatively heavily doped lower layer to the relatively lightly doped upper dielectric layer during, for example, heat treatment, and also impedes the migration of impurities from the upper dielectric layer to the lower layer during CMP planarization, thereby protecting the optimal memory retention characteristics of the lower dielectric layer while maintaining the optimal planarization characteristics of the upper layer throughout the fabrication process.

In accordance with a first embodiment of the present invention, both the lower and upper dielectric layers are formed using Borophosphosilicate glass (BPSG) and the intermediate isolation layer includes a Nitride layer. The concentration of Phosphorous in the BPSG of the lower dielectric layer is in the range of 7 to 9 weight percent, and the concentration of Phosphorous in the BPSG of the upper dielectric layer is in the range of 3 to 5 weight percent. In one specific embodiment, the BPSG of the lower dielectric layer includes a Boron-to-Phosphorous ratio of 3:8, while the upper dielectric layer includes a Boron-to-Phosphorous ratio of 2:4. These BPSG layers provide optimal doping concentrations in the lower and upper BPSG layers to facilitate memory retention and CMP planarization, respectively. Further, the Nitride film prevents the migration of Phosphorous from the lower BPSG layer to the upper BPSG layer during heat treatment, and prevents the migration of impurities to the lower BPSG layer that are introduced into the upper BPSG layer during CMP planarization.

In accordance with a second embodiment, upper dielectric layer is formed using Tetraethyl Orthosilicate Undoped Silicon Glass (TEOS USG). The lower dielectric layer is formed using BPSG and the intermediate isolation layer is formed using Nitride in the manner described above. The benefits of using a TEOS USG upper layer are similar to those provided above with reference to the first embodiment.

In accordance with yet another embodiment, a lower Nitride film and a lower USG layer are formed between the dielectric structure and the memory structures, thereby preventing the contamination of the memory structures.

In accordance with another embodiment of the present invention, a method of fabricating a CMOS device includes forming a memory structure on a substrate, forming a lower dielectric (e.g., BPSG) layer over the memory structure, forming an intermediate isolation layer on the lower dielectric layer, forming an upper dielectric (e.g., BPSG) layer on the intermediate isolation layer, and planarizing the upper dielectric layer using a chemical mechanical polishing process. As in the first embodiment, the lower dielectric layer has a doping concentration that is greater than that of the upper dielectric layer, thereby providing optimal memory retention and CMP planarization characteristics. Also, the intermediate isolation layer is formed by a Nitride film to prevent the migration of dopants and/or impurities between the upper and lower dielectric layers.

The novel aspects of the present invention will be more fully understood in view of the following description and drawings.

DETAILED DESCRIPTION

Figure 1:
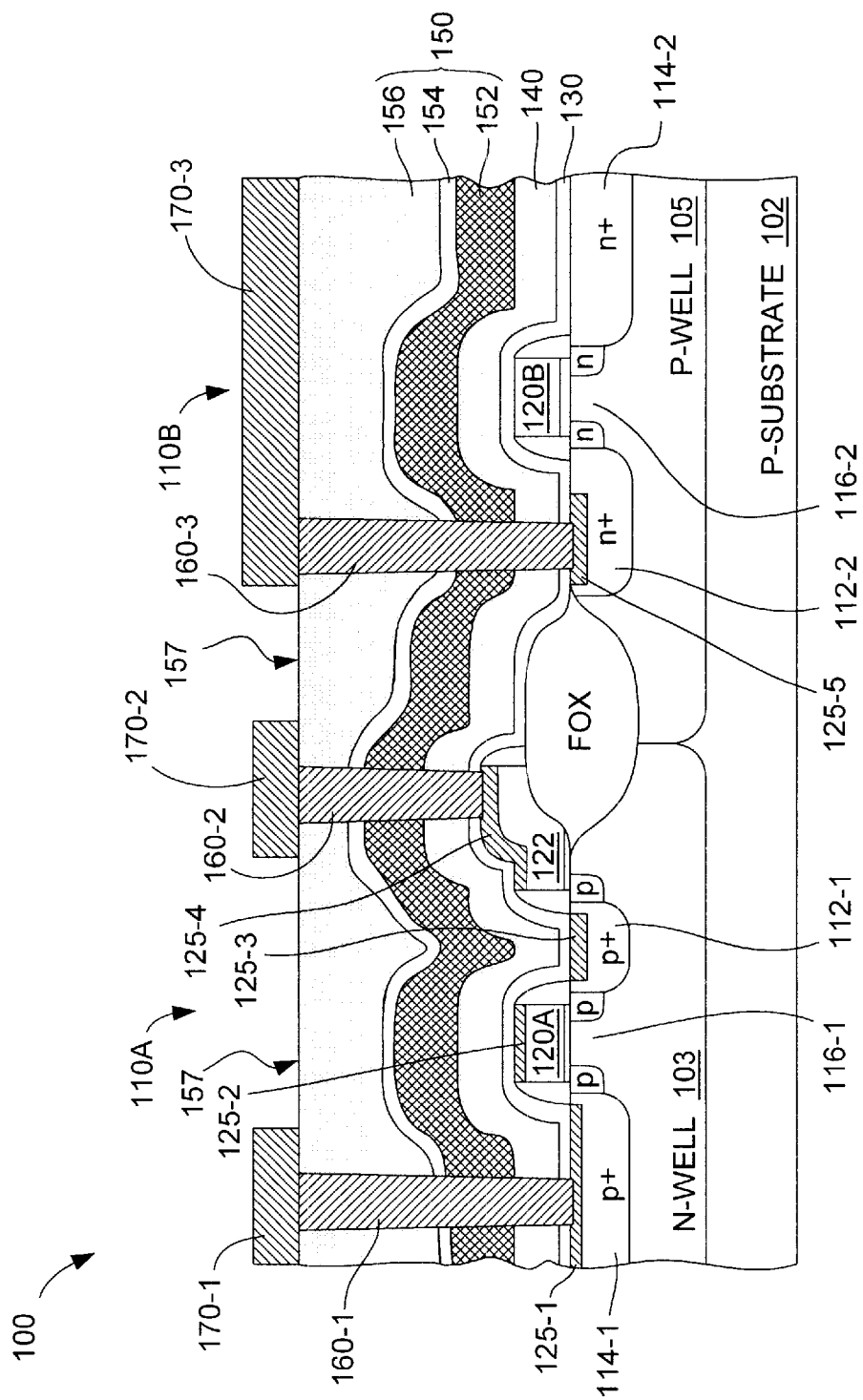
FIG. 1 is a cross-sectional side view showing a CMOS memory device that includes a pre-metal dielectric structure according to the present invention.

FIG. 1 is a cross-sectional side view showing a portion of a CMOS memory device 100 that incorporates a pre-metal dielectric structure in accordance with the present invention. While CMOS memory device 100 depicts a practical example including the present invention, it is understood that the pre-metal dielectric structure discussed below may be incorporated into other integrated circuit structures that are fabricated using advanced CMOS techniques. For example, one application for CMOS memory device 100 is in the 2-bit non-volatile memory arrays disclosed in co-owned and co-pending U.S. patent application Ser. No. 09/243,976, entitled "BIT LINE CONTROL CIRCUIT FOR A MEMORY ARRAY USING 2-BIT NON-VOLATILE MEMORY CELLS", which is incorporated herein by reference. Those of ordinary skill in the art will also recognize that the present invention can be used in any microelectronic device in which isolation between upper and lower dielectric layers is beneficial.

Referring to FIG. 1, CMOS device 100 includes transistor (memory) structures 110A and 110B (other transistor structures are omitted for clarity). Transistor structures 110A and 110B are formed on a semiconductor (e.g., silicon) substrate 102 between adjacent field oxide (FOX) regions (one shown). In the disclosed example, substrate 102 is doped with a p-type material, and includes an N-type well (N-well) region 103 and a p-type well (P-well) region 105. Transistor structure 110A is formed in N-well region 103, and transistor structure 110B is formed in P-well region 105. Transistor structures 110A and 110B respectively include first (e.g., source) diffusion regions 112-1 and 112-2 and second (e.g., drain) regions 114-1 and 114-2 formed by P-type and N-type materials that are diffused into N-well region 103 and P-well region 105. Polysilicon gate structures 120A and 120B are formed on gate oxide and respectively located over channel regions 116-1 and 116-2. A third polysilicon structure 122 is also provided that is partially formed on the field oxide region separating transistor structures 110A and 110B. Salicide regions 125-1 through 125-5 are formed on diffusion region 112-1, polysilicon gate structure 120A, diffusion region 114-1, polysilicon gate structure 122, and diffusion region 112-2, respectively.

In accordance with the disclosed embodiment, formed over transistor structures 110A and 110B are a (lower) Nitride film 130, a layer of undoped silicon glass (USG) 140, dielectric structure 150, and metal line structures 170-1 through 170-3. Nitride film 130 has a thickness in the range of 100 to 300 angstroms (Å) (e.g., 200 Å). USG layer 140 is formed on nitride film 130 and has a thickness in the range of 500 to 1,500 Å (e.g., 1,000 Å). The purpose of Nitride layer 130 and USG layer 140 is to protect against contamination of memory structures 110A and 110B by dielectric structure 150. Nitride film 130 and USG layer 140 may replaced by other materials that serve a similar protection function. Dielectric structure 150, which is discussed in detail below, is provided on USG layer 140 over transistor structures 110A and 110B. Extending through vias formed in dielectric structure 150 are contact structures 160-1 through 160-3 that provide electrical connections to diffusion region 112-1 (through salicide region 125-1), polysilicon structure 122 (through salicide region 125-4), and diffusion region 112-2 (through salicide region125-5). Metal line structures 170-1 through 170-3 are formed over pre-metal dielectric structure 150 and are respectively connected to contact structures 160-1 through 160-3.

In accordance with the present invention, dielectric structure 150 is a triple-layer, pre-metal structure that includes a lower dielectric layer 152 formed on USG layer 140, an intermediate isolation layer 154 formed on lower dielectric layer 152, and an upper dielectric layer 156 formed on intermediate isolation layer 154.

Lower dielectric layer 152 is formed from a relatively highly doped material that is selected to provide optimal retention protection for the underlying memory structures (i.e., polysilicon gate structures 120A and 120B). In one embodiment, lower layer 152 is formed using Borophosphosilicate glass (BPSG) having a Boron-to-Phosphorous ratio of 3:8 (weight percent), and has a thickness in the range of 2,000 to 6,000 Å (as used in a 0.5 micron CMOS flash fabrication process). BPSG 3:8 is particularly desirable because it includes Phosphorous in a concentration that provides optimal retention protection. However, suitable retention protection is provided by BPSG having Phosphorous in the range of 7 to 9 weight percent.

Intermediate isolation layer 154 is fabricated using a material that prevents migration of dopant from lower layer 152 to upper layer 156 during thermal cycling, and also prevents the migration of impurities from upper layer 156 to lower layer 152 during CMP planarization (discussed below). In one embodiment, intermediate isolation layer 154 is a Nitride film having a thickness of 100 to 300 Å (e.g., 200 Å). Nitride is particularly desirable because it forms an effective isolation barrier that prevents the upward migration of, e.g., Phosphorous from lower layer 152, and it is pliable enough to allow limited planarization of lower layer 152 by heat treatment.

Upper dielectric layer 156 is formed from an undoped or lightly doped material that facilitates CMP planarization, which is required in advanced CMOS fabrication processes. In one embodiment, upper layer 156 is a Tetraethyl Orthosilicate (TEOS) undoped silicate glass (USG) layer having a thickness in the range of 5,000 to 12,000 Å. In another embodiment, upper layer 156 is formed using Borophosphosilicate glass (BPSG) having a Boron-to-Phosphorous ratio of 2:4 (weight percent), also having a thickness in the range of 5,000 to 12,000 Å. BPSG 2:4 has a doping (i.e., Phosphorous) concentration that is relatively lower than that of lower layer 152, and is particularly desirable because it facilitates CMP planarization, which is required in advanced CMOS fabrication processes. However, BPSG having Phosphorous in the range of 2 to 5 weight percent provides suitable characteristics. Of course, TEOS USG has a lower doping concentration (by definition, and also facilitates CMP planarization.

Fabrication Process

Figure 2:
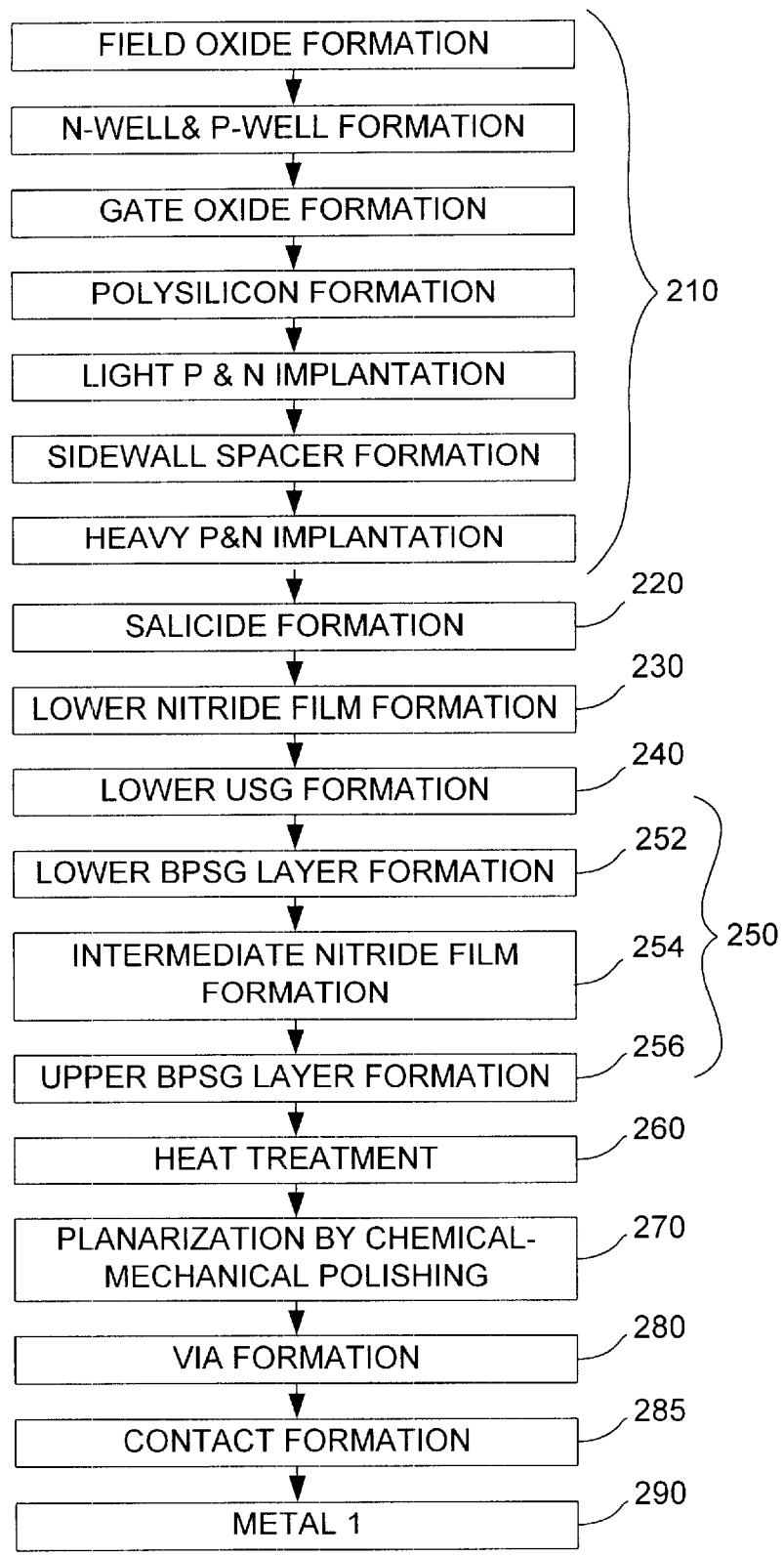
FIG. 2 is a flow diagram illustrating process steps associated with a CMOS fabrication process incorporating the present invention.

FIG. 2 is a flow diagram illustrating an example of a CMOS fabrication process including the major relevant process steps for producing the pre-metal dielectric structure in accordance with the present invention. FIGS. 3(A) through 3(J) are cross sectional views showing a CMOS memory device in various stages of production that are associated with the flow diagram shown in FIG. 2. Specifically, a series of preliminary steps 210 are performed to produce a structure having a polysilicon gate structure formed over a substrate (shown in FIG. 3(A)). Salicide is formed (step 220) at the end of preliminary steps 210 (shown in FIG. 3(A)). Nitride film 130 is then formed (step 230; FIG. 3(B)), and then USG layer 140 (step 240; FIG. 3(C)). Subsequently, dielectric structure 150 is fabricated (step 250) by forming lower dielectric (e.g., BPSG) layer 152 (step 252; FIG. 3(D)), forming intermediate isolation layer 154 (e.g., Nitride film) on lower dielectric layer 152 (step 254; FIG. 3(E)), and forming upper dielectric (e.g., BPSG or TEOS USG) layer 156 on intermediate isolation layer 154

(step 256; step 3(F)). The resulting structure is then subjected to an optional heat treatment process (step 260; indicated in FIG. 3(F)) that causes the various layers of dielectric structure 250 to "flow", thereby increasing its density and producing initial planarization. Planarization by CMP is then performed (step 270; FIG. 3(G)) to form planarized upper surface 157 (also shown in FIG. 1), and then vias are formed through dielectric structure 250 (step 280; FIG. 3(H)). Contact structures are then formed (step 285; FIG. 3(I)), and finally metal lines 170 are formed (step 290; FIG. 3(J)). Each of these steps is described in additional detail in the following paragraphs.

Figure 3A:
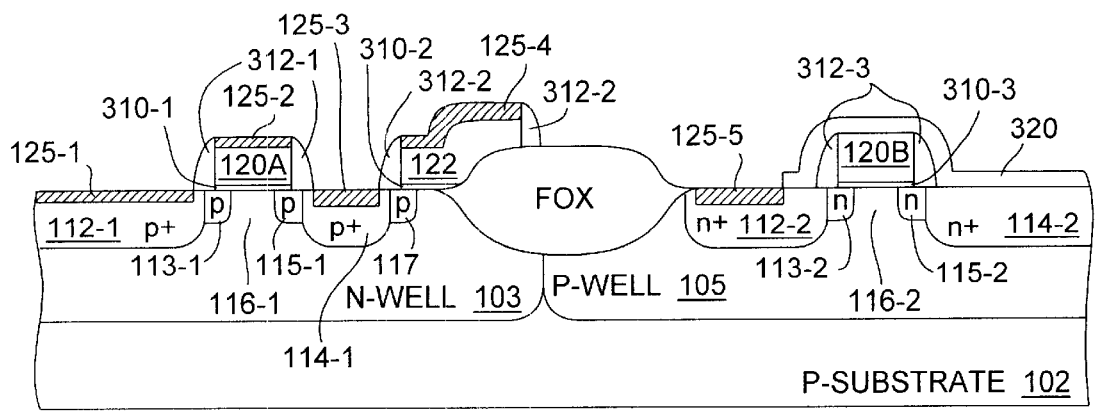
FIGS. 3(A) through 3(J) are cross-sectional views showing a CMOS memory device during various stages of fabrication in accordance with the flow diagram shown in FIG. 2.
Figure 3B:
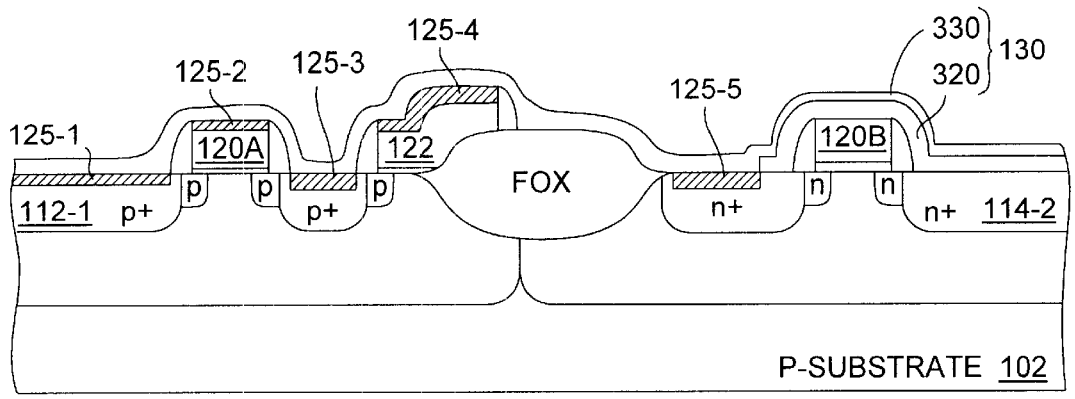
Figure 3C:
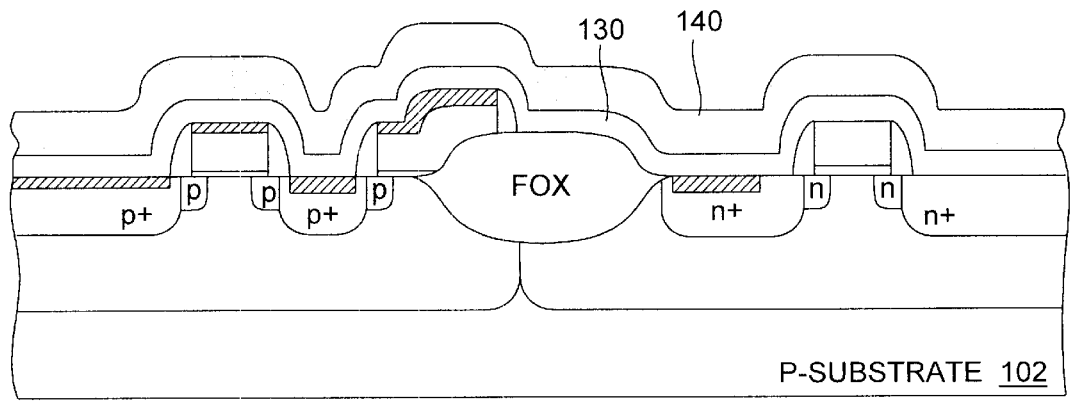
Figure 3D:
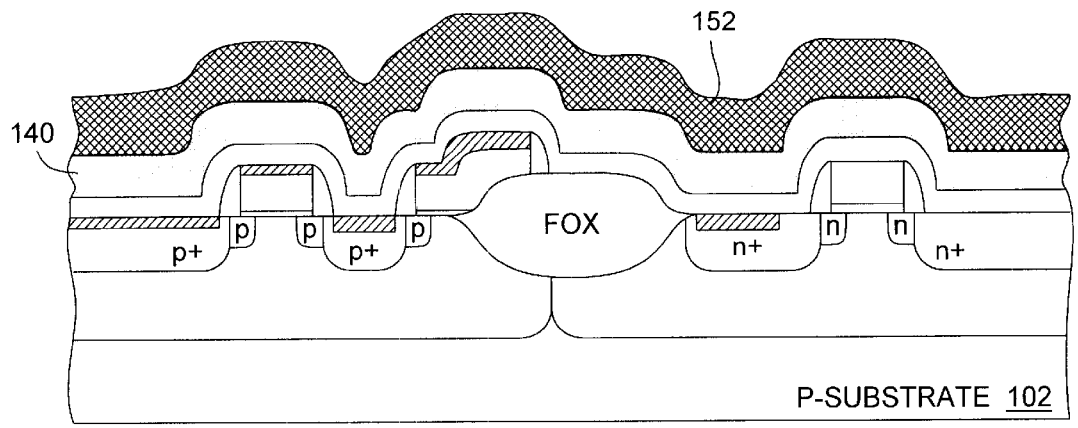
Figure 3E:
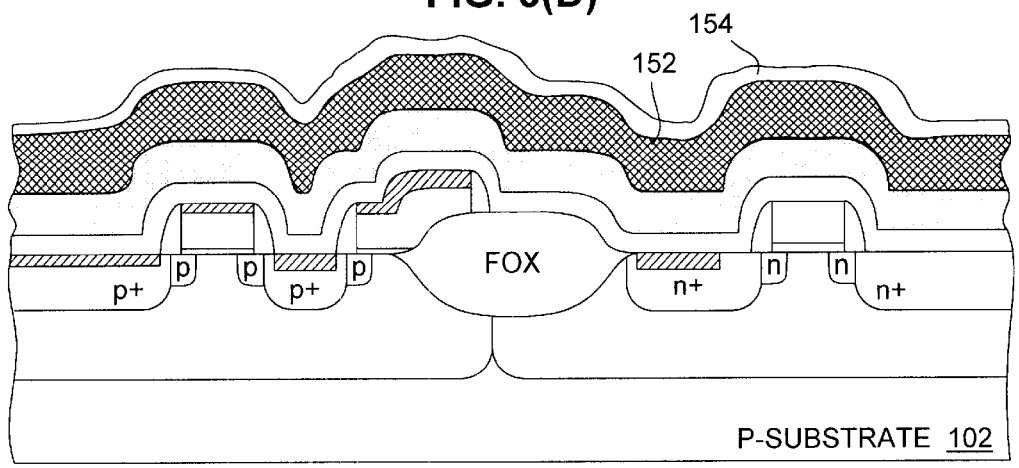

Referring to FIGS. 2 and 3(A), the CMOS fabrication process begins with preliminary steps 210 that are performed prior to the formation of the pre-metal dielectric structure. In one embodiment, preliminary steps 210 begin with the formation of an approximately 5,000 Å thick field oxide (FOX) structures using wet oxidation to isolate cell regions. Next, N-well region 103 and P-well region 105 are formed in semiconductor substrate 102, followed by the formation of a gate oxide layer and a polysilicon layer that are then etched to form gate oxide structures 310-1 through 310-3 on the substrate surface with polysilicon structures 120A, 122 and 120B, respectively, formed thereon (in an optional embodiment, polysilicon structure 122 may be omitted). Next, relatively lightly doped P-type and N-type regions are implanted into substrate 102 using the field oxide and polysilicon structures for alignment (along with appropriate masks). During subsequent steps, discussed below, these P-type and N-type regions form lightly-doped drain (LDD) regions 113-1, 113-2, 115-1, 115-2, and 117, which are shown in FIG. 3(A). Next, sidewall spacers 312-1 through 312-3 are formed on the sides of polysilicon structure 120A, 122, and 120B, respectively. Relatively heavily-doped P-type and N-type dopants are then implanted to form source and drain regions 112-1, 112-2, 114-1, and 114-2, which are aligned using the field oxide and sidewall spacers (along with appropriate masks). The fabrication methods used to form the structures associated with preliminary steps 210 are well-known, and additional details are not mentioned herein.

Referring again to FIG. 3(A), at the end of preliminary steps 210, salicide structures 125-1 through 125-5 are formed using known techniques on diffusion region 112-1, polysilicon structure 120A, diffusion region 114-1, polysilicon structure 222, and diffusion region 112-2, respectively (step 220; FIG. 2). Note that a partial Nitride film 320 is formed over polysilicon gate structure 120B and diffusion region 114-2 to prevent salicide formation on these structures/regions. Partial Nitride film 320 is formed using known techniques (e.g., plasma enhanced chemical vapor deposition (PECVD) using $Si_3N_4$).

Referring to FIG. 3(B), a next step of the fabrication process involves forming a blanket Nitride film 330 over exposed Salicide structures 125-1 through 125-5, partial Nitride film 320, and the field oxide (FOX) regions (step 230; FIG. 2). Nitride film 330 is also formed using a PECVD process using $Si_3N_4$ and has a thickness in the range of 100 to 300 Å (e.g., 200 Å). The combination of blanket Nitride film 330 and partial Nitride film 320 is referred to herein as (lower) Nitride film 130 (see FIG. 1).

FIG. 3(C) shows the subsequent formation of USG layer 140 on Nitride film 130 using a PECVD process (step 240; FIG. 2). USG layer 140 has a thickness in the range of 500 to 1,500 Å (e.g., 1,000 Å), and is formed using known techniques.

Figure 3F:
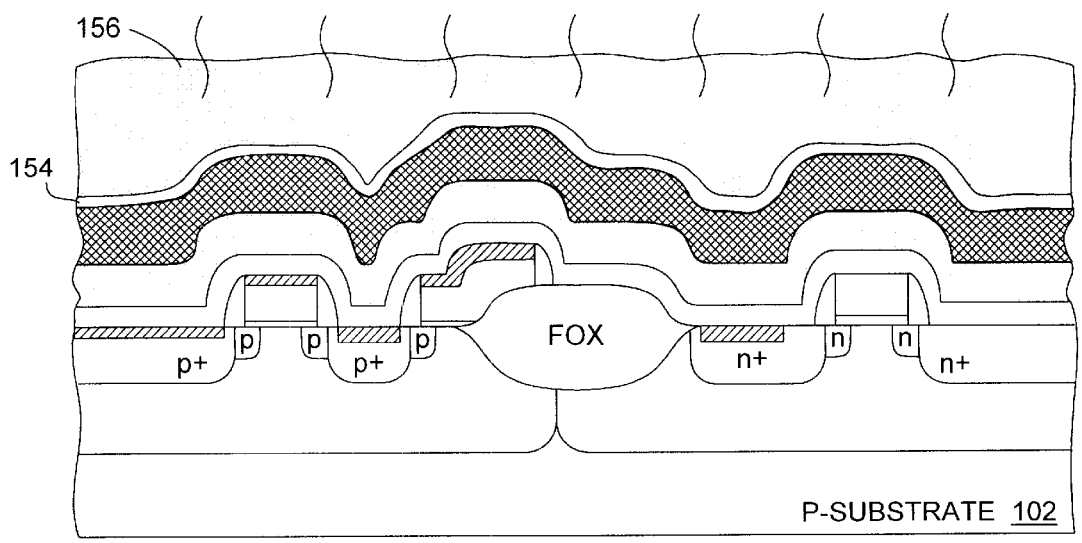
Figure 3G:
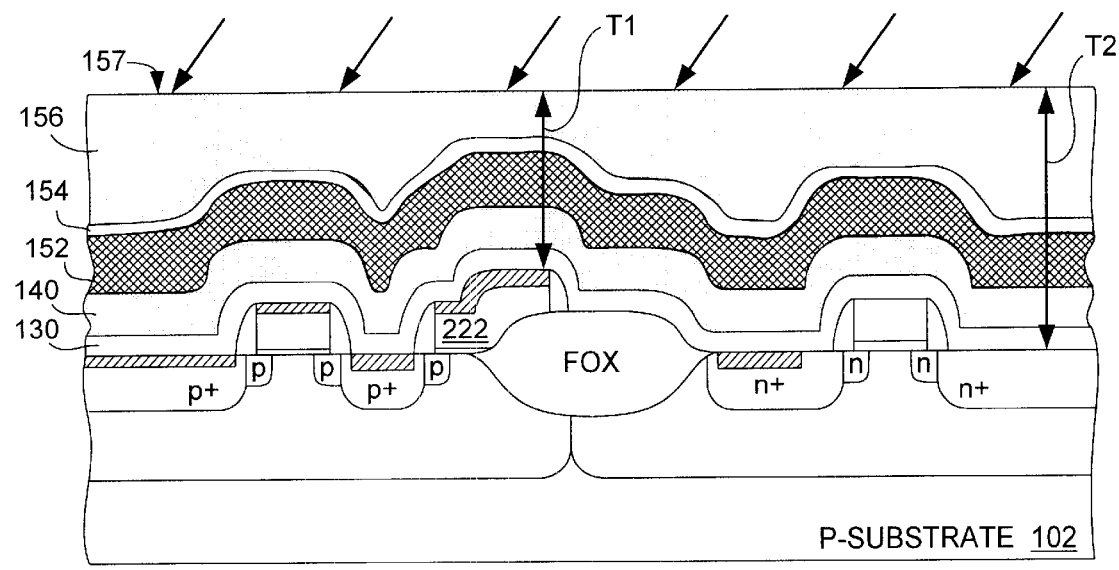
Figure 3H:
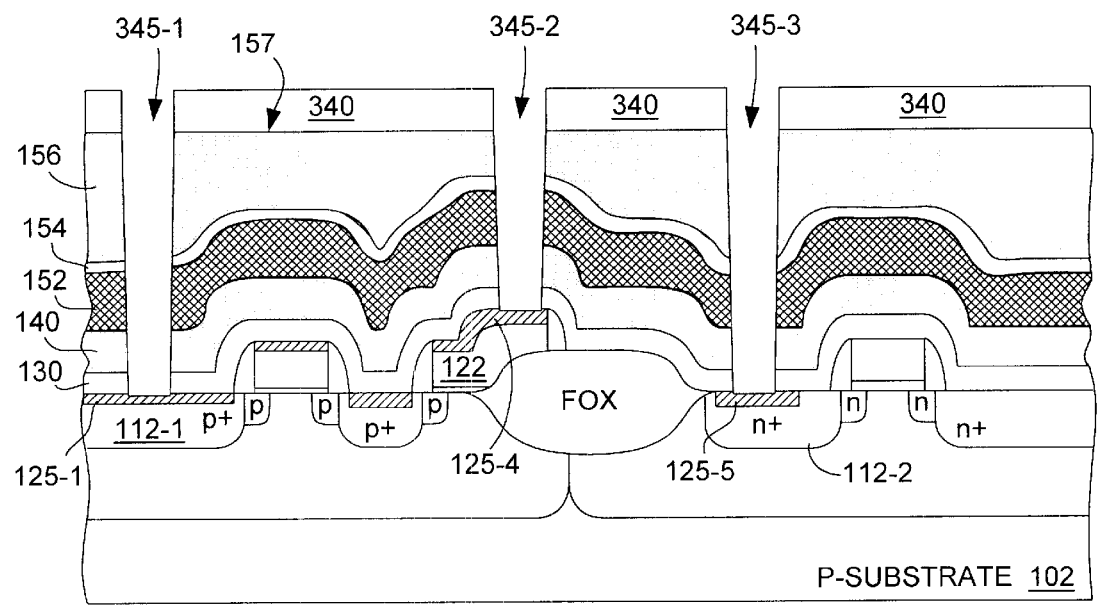
Figure 3I:
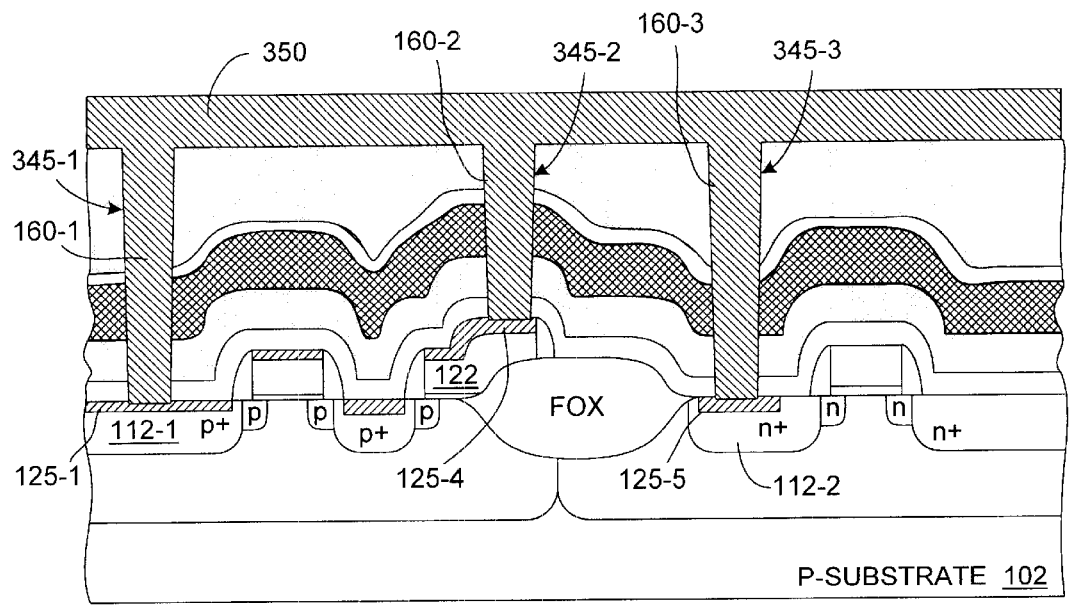
Figure 3J:
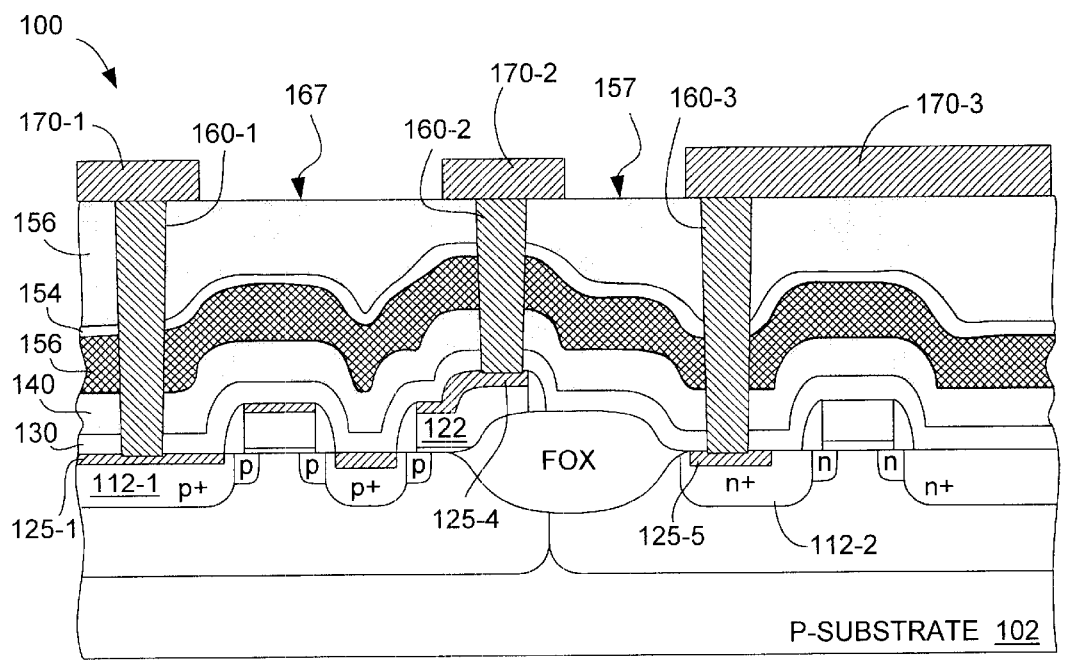

FIGS. 3(D) through 3(F) respectively show the formation of lower dielectric layer 152, intermediate isolation layer 154, and upper dielectric layer 156, which are collectively referred to as dielectric structure 150. The process steps that are associated with FIGS. 3(D) through 3(F) are collectively referred to in FIG. 2 as step 250.

Referring to FIG. 3(D), lower dielectric layer 152 is formed by depositing BPSG (3:8) onto USG layer 140 according to known techniques (step 252; FIG. 2). Note that BPSG (3:8) includes a relatively high amount of Phosphorous that provides optimal memory retention characteristics for the underlying memory structures. Note that BPSG (3:8) is typically not used as a pre-metal dielectric using conventional CMOS fabrication processes because of its tendency to impede CMP planarization. In one embodiment, the BPSG (3:8) of lower dielectric layer 152 is formed to a thickness in the range of 2,000 to 6,000 Å.

Referring to FIG. 3(E), intermediate isolation layer 154 is then formed by depositing a Nitride film onto lower dielectric layer 152 (step 254; FIG. 2). The Nitride film of intermediate isolation layer 154 is formed by a PECVD process using $Si_3N_4$, and has a thickness in the range of 100 to 300 Å (e.g., 200 Å). As discussed above, intermediate isolation layer 154 prevents the migration of, for example, Phosphorous from lower dielectric layer 152 during heat treatment, thereby facilitating the use of BPSG (3:8) in lower dielectric layer 152 without impeding the planarization of upper dielectric layer 156.

Referring to FIG. 3(E), according to one embodiment, upper dielectric layer 156 is formed by depositing BPSG (2:4) onto intermediate isolation layer 252 using known techniques (step 256; FIG. 2). Note that EPSG (2:4) includes a relatively low amount of Phosphorous that facilitates optimal CMP planarization. Alternatively, TEOS USG is deposited on intermediate isolation layer 252 using known techniques. Upper dielectric layer 156 is formed to a thickness in the range of 5,000 to 12,000 Å.

After the three layers of the pre-metal dielectric structure are deposited, an optional heat treatment step 260 is used to cause dielectric structure 150 to "flow", thereby increasing the density of dielectric structure 150, and producing rough planarization (this step is depicted in FIG. 3(F) by wavy lines). It is during this heat treatment step that first and second important aspects of intermediate isolation layer 154 become apparent. First, intermediate isolation layer 154 is selected from a material that prevents the upward migration of, e.g., Phosphorous atoms, from the relatively highly-doped lower layer 152 to the relatively lightly-doped upper layer 156 during heat treatment, thereby maintaining the optimal memory retention characteristics of lower layer 152. A second important aspect is associated with the thickness of intermediate isolation layer 154. The thickness must be selected to provide an optimal barrier to dopant migration (discussed above), and also to maximize the amount of "flow" of upper layer 156 and lower layer 152. The degree of "flow" of these layers is a function of Boron and Phosphorous concentrations. The present inventors have determined that suitable migration prevention and "flow" are achieved when intermediate isolation layer 154 is formed using Nitride having a thickness in the range of 100 to 300 Å.

CMP planarization (step 270; FIG. 2) is then performed using known techniques. Referring to FIG. 3(G), a planarized upper surface 157 is formed on upper layer 156 during the CMP process, thereby facilitating subsequent metallization. In one embodiment, a goal of planarization is to produce a combined thickness T1 of lower Nitride layer 130, USG layer 140, and dielectric structure 150 over polysilicon structure 222 of approximately 4,500 Å. A similar thickness T2 of these layers over an upper surface of substrate 102 is approximately 9,500 Å.

It is during the CMP planarization process that a third important aspect of intermediate isolation layer 154 becomes clear. Specifically, CMP is known as a "dirty" process in that it introduces significant contamination that can be incorporated into the polished upper layer 156. These contaminants can migrate from upper layer 156 to lower layer 152, thereby diminishing the memory retention characteristics of lower layer 152. Therefore, in addition to its function of preventing upward migration of dopant from lower layer 152, intermediate isolation layer 154 must also prevent the downward migration of contaminants introduced into upper layer 156 (and additional layers formed over upper layer 156) during CMP processes. Again, the present inventors have determined that Nitride in the range of 100 to 300 Å provides this cross-diffusion function while maximizing the "flow" of lower layer 152 and upper layer 156 during heat treatment.

After CMP planarization, the formation of Metal 1 structures is performed according to known techniques. Referring to FIG. 3(H), metallization begins with the deposition of masking material 340 and subsequent etching that form vias 345-1 through 345-3. Vias 345-1 through 345-3 extend through upper dielectric layer 156, intermediate isolation layer 154, lower dielectric layer 152, USG layer 140 and lower Nitride film 130 to expose Salicide structures 125-1, 125-4, and 125-5 formed on diffusion region 112-1, polysilicon structure 122, and diffusion region 112-2, respectively (step 280; FIG. 2). As shown in FIG. 3(I), contact structures 160-1 through 160-3 are then formed in vias 135-1 through 135-3, respectively, using known techniques (step 285; FIG. 2). Finally, metal lines 170-1 through 170-3 are formed on planarized upper surface 157 of pre-metal dielectric structure 150 using known techniques to provide required connections to the underlying memory structures.

Although the invention has been described in connection with several embodiments, it is understood that this invention is not limited to the embodiments disclosed, but is capable of various modifications which would be apparent to a person skilled in the art. For example, the particular parameters set forth in the above examples are exemplary, and may be altered to meet the requirements of particular fabrication processes. Thus, the invention is limited only by the following claims.

What is claimed is:

1. A dielectric structure for a CMOS memory device, the CMOS memory device including a memory structure, the dielectric structure comprising:

a lower dielectric layer formed over the memory structure, the lower dielectric layer having a first doping concentration;

an intermediate isolation layer formed on the lower dielectric layer, and an upper dielectric layer formed on the intermediate isolation layer, the upper dielectric layer having a second doping concentration;

wherein the first doping concentration of the lower dielectric layer is greater than the second doping concentration of the upper dielectric layer, and wherein the intermediate isolation layer includes a material that impedes migration of the dopant from the lower dielectric layer to the upper dielectric layer.

2. The dielectric structure according to claim 1, wherein the lower dielectric layer consists essentially of Borophosphosilicate glass (BPSG), and wherein a ratio of Boron to Phosphorous in the lower dielectric layer is 3:8.

3. The dielectric structure according to claim 2, wherein the lower layer has a thickness in the range of 2000 to 6000 Å.

4. The dielectric structure according to claim 1, wherein the upper dielectric layer consists essentially of Borophosphosilicate glass (BPSG), and wherein a ratio of Boron to Phosphorous in the upper dielectric layer is 2:4.

5. The dielectric structure according to claim 4, wherein the upper dielectric layer has a thickness in the range of 5000 to 12000 Å.

6. The dielectric structure according to claim 1, wherein both the lower dielectric layer and the upper dielectric layer consist essentially of Borophosphosilicate glass (BPSG), and wherein the concentration of Phosphorous in the lower dielectric layer is in the range of 7 to 9 weight percent, and the concentration of Phosphorous in the upper dielectric layer is in the range of 3 to 5 weight percent.

7. The dielectric structure according to claim 1, wherein the upper layer comprises Tetraethyl Orthosilicate (TEOS).

8. The dielectric structure according to claim 1, wherein the intermediate isolation layer comprises a Nitride film having a thickness in the range of 100 to 300 Å.

9. The dielectric structure according to claim 1, further comprising:

a lower Nitride film formed on the memory structure; and an undoped silicon glass layer formed between the lower Nitride layer and the lower dielectric layer.

10. The dielectric structure according to claim 9, wherein the lower Nitride film has a thickness in the range of 100 to 300 Å; and wherein the undoped silicon glass layer has a thickness in the range of 500 to 1500 Å.

11. A CMOS device comprising:

a substrate;

first and second diffusion regions formed in the substrate;

a polysilicon gate structure formed over a channel region of the substrate, the channel region being located between the first and second diffusion regions; and a pre-metal dielectric structure formed over the polysilicon gate structure and the first and second diffusion regions, the pre-metal dielectric structure including:

a lower Borophosphosilicate glass (BPSG) layer formed on an upper surface of the polysilicon gate structure, an intermediate Nitride layer formed on the lower BPSG layer, and an upper dielectric layer formed on the intermediate Nitride layer;

wherein a concentration of Phosphorous in the lower BPSG layer is greater than a concentration of Phosphorous in the upper dielectric layer.

12. The CMOS device according to claim 11, further comprising:

a lower Nitride layer formed on the polysilicon gate structure; and an undoped silicon glass layer formed between the Nitride layer and the lower BPSG layer.

13. The CMOS device according to claim 11, wherein the upper dielectric layer consists essentially of Borophosphosilicate glass (BPSG), and wherein the concentration of Phosphorous in the lower BPSG layer is in the range of 7 to 9 weight percent, and the concentration of Phosphorous in the upper dielectric layer is in the range of 3 to 5 weight percent.

14. A method of fabricating a CMOS device, the method comprising:

forming a memory structure on a substrate;

forming a lower dielectric layer over the memory structure, the lower dielectric layer having a first doping concentration;

forming an intermediate isolation layer on the lower dielectric layer;

forming an upper dielectric layer on the intermediate isolation layer, the upper dielectric layer having a second doping concentration that is less than the first doping concentration; and planarizing the upper dielectric layer using a chemical mechanical polishing process.

15. The method according to claim 14, wherein the step of forming the lower dielectric layer comprises forming a layer of Borophosphosilicate glass (BPSG) having a Boron-to-Phosphorous ratio of 3:8.

16. The method according to claim 14, wherein the step of forming the intermediate isolation layer comprises forming a Nitride film having a thickness in the range of 100 to 300 Å.

17. The method according to claim 14, wherein the step of forming the upper dielectric layer comprises forming a layer of Borophosphosilicate glass (BPSG) having a Boron-to-Phosphorous ratio of 2:4.

18. The method according to claim 14, wherein the step of forming the upper dielectric layer comprises forming Tetraethyl Orthosilicate (TEOS).

19. The method according to claim 14, further comprising:

forming a lower Nitride film on the memory structure; and forming an undoped silicon glass layer on the Nitride film such that the undoped silicon glass layer is sandwiched between the Nitride layer and the lower dielectric layer.

20. The method according to claim 14, further comprising forming a metal conductor on a planarized upper surface of the upper dielectric layer.

* * * * *